United States Patent
Sharan et al.

(10) Patent No.: US 10,152,621 B2
(45) Date of Patent: Dec. 11, 2018

(54) IDENTIFICATION OF MINIATURIZED ELECTRONIC ASSEMBLY USING IDENTIFICATION FEATURES ON MULTIPLE COMPONENTS

(71) Applicant: BIOTRONIK SE & Co. KG, Berlin (DE)

(72) Inventors: Alok Sharan, Lake Oswego, OR (US); Anthony A. Primavera, Newberg, OR (US)

(73) Assignee: BIOTRONIK SE & Co. KG, Berlin (DE)

( * ) Notice: Subject to any disclaimer, the term of this patent is extended or adjusted under 35 U.S.C. 154(b) by 7 days.

(21) Appl. No.: 15/634,347

(22) Filed: Jun. 27, 2017

(65) Prior Publication Data
US 2018/0018484 A1 Jan. 18, 2018

Related U.S. Application Data

(60) Provisional application No. 62/362,063, filed on Jul. 14, 2016.

(51) Int. Cl.
*G06K 7/10* (2006.01)
*G06K 7/12* (2006.01)
*H05K 1/02* (2006.01)

(52) U.S. Cl.
CPC ..... *G06K 7/10366* (2013.01); *G06K 7/10722* (2013.01); *G06K 7/12* (2013.01);
(Continued)

(58) Field of Classification Search
CPC .. G06K 7/10366; G06K 7/10722; G06K 7/12; G06K 7/1434
(Continued)

(56) References Cited

U.S. PATENT DOCUMENTS 3,621,250 A * 11/1971 Wetzstein ............... G06K 1/12
235/468
6,573,523 B1 * 6/2003 Long .................... G06K 9/2036
235/454
(Continued)

FOREIGN PATENT DOCUMENTS

WO 2015054188 A1 4/2015

OTHER PUBLICATIONS

European Search Report and Annex to the European Search Report on European Patent Application No. EP 16 18 2688.8, dated Dec. 11, 2017 (8 pages).

*Primary Examiner* — Paultep Savusdiphol
(74) *Attorney, Agent, or Firm* — Buchanan Ingersoll & Rooney PC

(57) ABSTRACT

A system and method for marking components of an assembly and/or portions of an assembly including at least one of the components with a plurality of markers, each component and/or portion including its own marker or markers, to be read in an operational sequence so as to generate at least one identifier representative of a characteristic and/or feature of the assembly. Any marker can be a certain type of marker, the combination of which can be used to generate an identifier. A certain type of marker 1 need not be dedicated to a certain component. Each marker can be associated with a proxy value, which can be obtained by reading the marker with a reader. An identifier of the assembly can then be generated by employing a predetermined sequence of reading the markers.

17 Claims, 3 Drawing Sheets

(52) U.S. Cl.
CPC ......... *H05K 1/0269* (2013.01); *H05K 1/0266* (2013.01); *H05K 2201/09918* (2013.01); *H05K 2201/09927* (2013.01); *H05K 2201/09936* (2013.01); *H05K 2201/10098* (2013.01); *H05K 2201/2054* (2013.01)

(58) Field of Classification Search
USPC .......... 235/454, 462.04, 462.08, 462.12, 494
See application file for complete search history.

(56) References Cited

U.S. PATENT DOCUMENTS

| | | | | |
|---|---|---|---|---|
| 8,463,426 | B1* | 6/2013 | Rogers | G06Q 10/087 235/375 |
| 2002/0168097 | A1* | 11/2002 | Neubauer | G06K 9/3241 382/145 |
| 2003/0208418 | A1* | 11/2003 | Caputo | G06Q 10/087 705/28 |
| 2007/0210164 | A1* | 9/2007 | Conlon | G06Q 10/08 235/462.01 |
| 2015/0278753 | A1* | 10/2015 | Hookom | G06Q 10/087 235/385 |

\* cited by examiner

IDENTIFICATION OF MINIATURIZED ELECTRONIC ASSEMBLY USING IDENTIFICATION FEATURES ON MULTIPLE COMPONENTS

CROSS-REFERENCE TO RELATED APPLICATIONS

This patent application claims the benefit of co-pending U.S. Provisional Patent Application No. 62/362,063, filed on Jul. 14, 2016, which is hereby incorporated by reference in its entirety.

FIELD OF THE INVENTION

Embodiments of the present invention are directed toward identification of an assembly (e.g., medical devices, printed circuit boards, etc.) comprising at least one component and, in particular, marking components and/or portions of the assembly with a plurality of markers to be read in a predetermined operational sequence so as to generate at least one identifier representative of a characteristic and/or feature of the assembly (e.g., a serial number or identification code).

BACKGROUND OF THE INVENTION

Many devices are marked with serial numbers, identification codes, Quick Reference ("QR") codes, or other identifiers to assist with identifying the device or a feature or characteristic of the device. This can assist with inventory management, supply chain management, and quality assurance management. Many forms of marking include providing the identifier mark on a surface of the device, wherein the identifier mark is the complete serial number or identification code. However, this requires reservation of otherwise usable space for placement and display of the identification code. Reserving space for identifier marks can be problematic for devices that are specifically designed to occupy a small volume of space. For instance, the desire to make electrical devices smaller in the field of modern electronics has led to the impetus to use as much space as possible on the device. The premium for usable space is especially prevalent on printed circuit boards ("PCBs"), and even more prevalent on miniaturized PCBs. The current trend for miniaturized electronic assemblies leaves very little to no space for identification markings e.g., labels, bar codes, human readable text, etc.). Thus, reserving space for a serial number or identification code can significantly limit the "miniaturization" efforts of the device, and even increase costs associated with producing and using the device.

Further, with the advent of information technology, there is an impetus to obtain more robust information from a data acquisition set and a data processing scheme. While a serial number or identification code can be used to access a host of data related to the characteristics of the device, the serial number or identification code only embodies one piece of identifying information. A user, or a system, must then reference another data store to look up the information associated with the identifying information. Thus, current marking technologies fail to provide a means to generate a plurality of identifying and other characteristic information from a marked device.

The present invention is directed toward overcoming one or more of the above-identified problems.

SUMMARY OF THE INVENTION

Embodiments of the present invention are directed toward marking components of a device and/or portion of an assembly comprising at least one of the components with a plurality of markers to be read in an operational sequence so as to generate at least one identifier that may be representative of the device or of a characteristic and/or feature of the device/assembly. As used herein, the terms "device" and "assembly" may be used interchangeably. Any one marker of the plurality of markers can be a certain type of marker, the combination of which can be used to generate the identifier. With the disclosed system and method, a certain type of marker need not be dedicated to a certain type of component. For example, any number of and/or all components of the assembly can be associated with a marker-1 type marker. Similarly, any number of and/or all components can be associated with a marker-2 type marker. In general, any number of and/or all components can be associated with a marker-i type marker, whereby "i" is a variable and can have the values of i={1, 2, 3, . . . }.

Each marker can be associated with a proxy value (e.g., number, letter, etc.), which can be obtained by the system reading the marker with a reader. An identifier of the assembly or device can then be generated by utilizing a predetermined sequence of reading the markers. For example, the markers can be scanned, the proxy values acquired and/or the data processed to form the combination of proxy values, and the identifiers can be generated in any number of ways. With such a method and system, a plurality of identifiers for an assembly can be obtained with the same or any number of markers. This is because any number of reading sequences (e.g., scanning sequences, data acquisition sequences, and/or data processing sequences) can be used to read the markers. For example, the markers can be scanned in a number of ways and/or by a number of scan sequences. Further, data acquisitioning of the proxy values can be performed in a number of ways and/or by a number of acquisitioning sequences. And, data processing to form the combination of proxy values, and thus the generation of identifier(s), can also be performed in a in a number of ways and/or by a number of data processing sequences.

Since the markers are typically provided on a component or a portion of the device/assembly, a large block of space does not need to be set aside to the identification code. Each component or portion of the device can be marked with a single marker in a limited space available and, thus, free up other space for use. This enable the limited space, especially when utilized with miniaturized PCB's, to be optimally utilized.

In one embodiment a method for identifying an assembly is provided which includes providing a plurality of markers on components of the assembly and/or portions of the assembly, each of the plurality of markers having an associated proxy value which comprises a sub-block of an identifier of the assembly; reading the plurality of markers on the components of the assembly and/or the portions of the assembly with a reader by performing at least one of a scanning sequence, a data acquisition sequence, and a data processing sequence, wherein the reading step is performed in a predetermined sequence; and decrypting, with a processor, the proxy values of detected markers in the predetermined sequence to generate the identifier of the assembly.

In one form, the assembly may include a printed circuit board ("PCB"), for example, a miniaturized PCB, a medical device or other device. The identifier may be associated with the assembly itself or at least one of a feature and a characteristic of the assembly.

Each of the plurality of markers may include a distinguishable feature capable of being read by the reader. The distinguishable feature may include at least one marker type, and wherein the marker type includes a number of dots, a shape, a color, a shade, an indentation, a protrusion, a chemical or a fluorescence capable of being read by the reader.

In another embodiment, a method for generating an identification number of an assembly is provided which includes marking components of the assembly and/or portions of the assembly with a sequence of coded portions of the identification number of the assembly; reading the coded portions with a reader in a predetermined sequence; the predetermined sequence corresponding to the identification number of the assembly as represented by the coded portions; and decrypting, with a processor, the read coded portions to generate the identifier of the assembly.

In one form, the reading step may include performing at least one of a scanning sequence, a data acquisition sequence, and a data processing sequence. The coded portions may include markers provided on the components and/or the portions of the assembly, wherein each of the markers has an associated proxy value which comprises a sub-block of the identifier of the assembly. Each of the plurality of markers includes a distinguishable feature capable of being read by the reader, the distinguishable feature comprises at least one marker type, and wherein the marker type includes a number of dots, a shape, a color, a shade, an indentation, a protrusion, a chemical or a fluorescence capable of being read by the reader.

In another embodiment, a system for identifying an assembly is provided which includes a plurality of markers provided on components and/or portions of the assembly, wherein each marker of the plurality of markers comprises a type of marker and each type of marker is further associated with a proxy value which comprises a sub-block of an identifier of the assembly; a reader capable of reading the plurality of markers by at least one of a scanning sequence, a data acquisition sequence, and a data processing sequence; and a processor receiving data from the reader corresponding to the read markers and decrypting the received data to determine the respective proxy values and generate an identifier of the assembly.

The type of marker can include at least one of a distinguishable feature capable of being read by the reader, with the distinguishable feature comprising at least one marker type, and wherein the marker type includes a number of dots, a shape, a color, a shade, an indentation, a protrusion, a chemical or a fluorescence capable of being read by the reader.

The reader reads the markers in a predetermined sequence correspond to the identifier of the assembly. In one embodiment, the processor determines the respective proxy values and generates the identifier of the assembly Data Processing Table which correlates the markers with respective proxy value.

The reader may read the plurality of markers in a scheme that is at least one of a series order, a parallel order, and a series-parallel order. The reader can be at least one of a RFID reader, an optical camera, a chemical sensor, an infrared emitter, and a visual based tool to sense color, shape, size, chemicals, number of features, size, and/or shapes of feature.

While these potential advantages are made possible by technical solutions offered herein, they are not required to be achieved. The presently disclosed system and method can be implemented to achieve technical advantages, whether or not these potential advantages, individually or in combination, are sought or achieved.

Further features, aspects, objects, advantages, and possible applications of the present invention will become apparent from a study of the exemplary embodiments and examples described below, in combination with the Figures, and the appended claims.

BRIEF DESCRIPTION OF THE DRAWINGS

The above and other objects, aspects, features, advantages and possible applications of the present invention will be more apparent from the following more particular description thereof, presented in conjunction with the following Figures, in which.

DETAILED DESCRIPTION OF THE INVENTION

The following description is of an embodiment presently contemplated for carrying out the present invention. This description is not to be taken in a limiting sense, but is made merely for the purpose of describing the general principles and features of the present invention. The scope of the present invention should be determined with reference to the claims.

Figure 1:
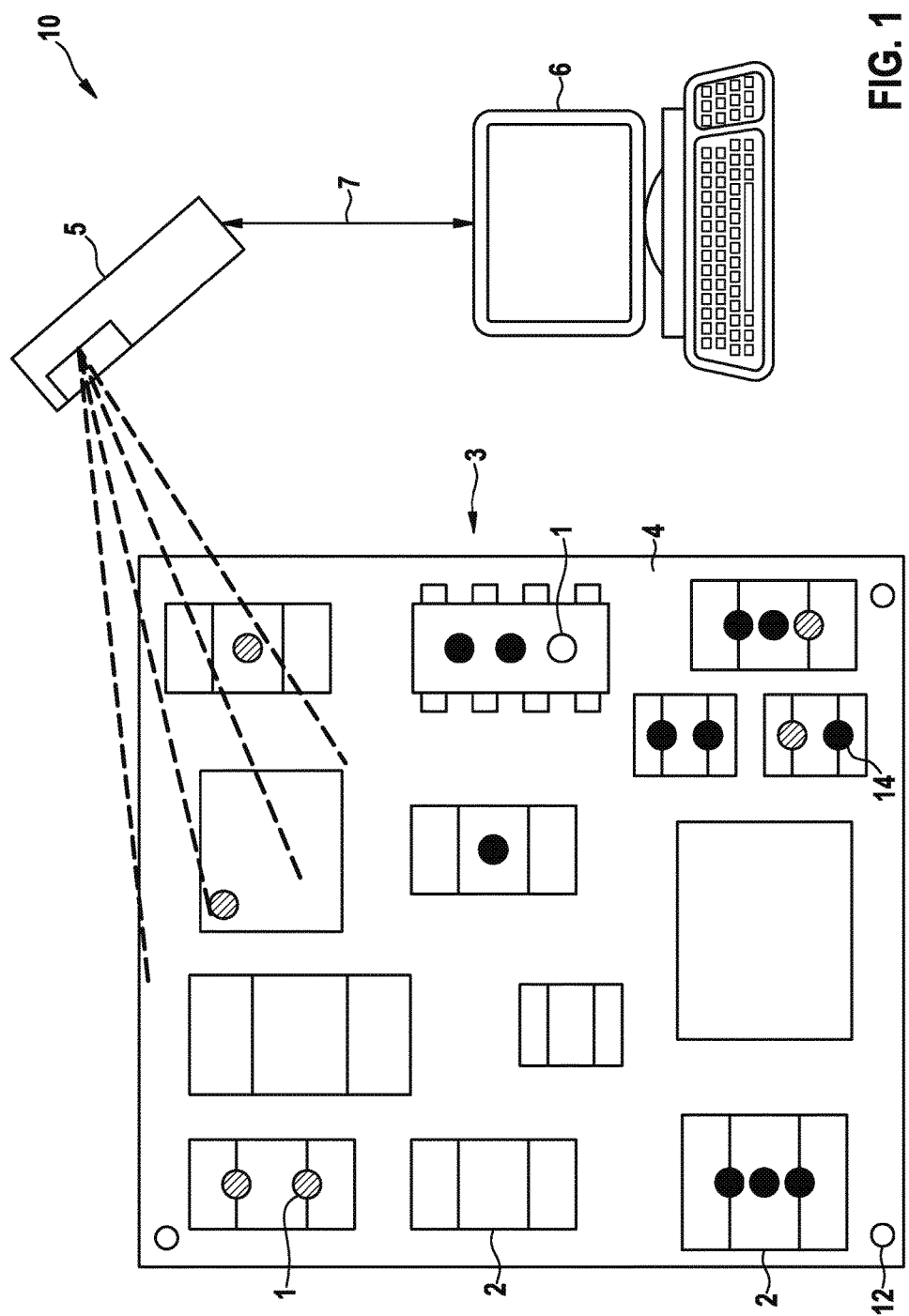
FIG. 1 is an exemplary system for identifying an assembly.

Referring to FIG. 1, embodiments of the disclosed system 10 and method can include a plurality of markers 1, the combination of which can be used to generate an identifier of the device/assembly (e.g., identification number, serial number, etc.). Some embodiments can include a plurality of marker types. For example, marker-1 type can be made to represent a numerical proxy value of "1" and marker-2 type can be made to represent a numerical proxy value of "2". A combination of marker-1 and marker-2, in that order, may generate an identifier of: (a) 1, 2; or (b) (1+2)=3; or (c) (1−2)=−1; or (d) 12; etc. Similarly, a combination of marker-2 and marker-1, in that order, may generate an identifier of: (a) 2, 1; or (b) (2+1)=3; or (c) (2−1)=1; or (d) 21; etc.

In another example, the proxy values can be letters. For example, marker-1 type can be made to represent a letter proxy value of "A" and marker-2 type can be made to represent a letter proxy value of "B". A combination of marker-1 and marker-2, in that order, may generate an identifier A, B or AB. Similarly, a combination of marker-2 and marker-1, in that order, may generate an identifier B, A or BA. The proxy values may represent letters, numbers, symbols, etc. and may be combined so that the resultant identifier may be any combination of letters, numbers, symbols, etc. Of course, other orderings, arithmetic applications, algebraic applications, means of combining the proxy values of the markers 1, etc. can be used to generate an identifier. It is contemplated for the markers 1 to be associated with components 2 of an assembly 3, or portions of the assembly 3, and for the identifier(s) to be associated with the assembly 3 or a feature and/or characteristic of the assembly 3 so that a reading of the marker proxy values can produce the identifier(s) of the assembly.

As indicated above, some implementations may include associating at least one marker 1 with a component 2 of an assembly 3 or a portion of an assembly 3. For example, a marker 1 can be attached to a component 2, be a feature of the component 2, embedded within the component 2, in electrical and/or mechanical connection with the component 2, etc. A marker 1 can be any distinguishable feature capable of being identified from the component 2, or portion of the assembly 3, the marker 1 is associated with. For example, a marker 1 can be a print of ink placed on the component 2, wherein the print of ink has a unique, or otherwise distinguishable, number of dots, number of stripes, size (e.g., in the x, y, and/or z direction), shape, color, shade, translucence, conductivity, reflectance, refractive index, and/or some other chemical, mechanical, and/or material property. A marker 1 can be a notch, protrusion or formation formed into or onto the object (e.g., the component 2 or the assembly 3), wherein the notch, protrusion or formation has a specific size (e.g., in the x, y, and/or z direction), shape, indentation, protrusion, diffractive grating, magnetic property, optical property, and/or some other chemical, mechanical, and/or material property. A marker 1 can be an inherent property of the object itself, such as the size (e.g., in the x, y, and/or z direction), shape, conductivity, reflectance, and/or some other chemical, mechanical, and/or material property. A marker 1 can be a radio frequency identification ("RFID") tag, an integrated circuit ("IC"), or other electrical device capable of generating a signal. A marker 1 can be a chemical agent that reacts under certain conditions to generate a detectable signal (e.g., a fluorescence agents, redox agents, etc.). A marker 1 can be a smart material (e.g., shape memory polymer, piezoelectric material, halochromic material, etc.) that produces an expected response to an induced condition, and thus generates a detectable signal. A marker 1 can be an infrared ("IR") absorption material (e.g., tungsten or carbon-based material) applied to the object that can be used to generate a contrast in imagery when IR light and/or near IR light is incident upon it.

All of the above examples of markers 1 are exemplary only, and do not limit the types of markers that can be implemented with the present invention. A marker 1 can be any distinguishable feature, or combination of features, capable of being identified from the component, or portion of the assembly, the marker is associated with.

As noted above, it is contemplated for the system 10 and method to be utilized to identify a device or assembly 3, or features and/or characteristics of the device/assembly 3. For example, a marker 1 can be associated with at least one component 2 used to make a printed circuit board ("PCB"), or a portion of the PCB, where the PCB is the assembly. For example, a PCB is shown in FIG. 1 and includes various markers 1 provided on various components 2 and portions of the PCB substrate 4. The markers 1 can be placed on a usable portion of the component/assembly 3, so as to minimize the space needed. As shown in FIG. 1, some of the components 2 have markers 1, and some do not. The markers 1 can be placed on the substrate 4; however, they may be placed at any predetermined location as space permits, for example but not limited to a placement at the corners of the PCB.

Other assemblies can be, but are not limited to, medical devices, automobile parts, mobile electronic devices, etc. Thus, in some embodiments, the markers 1 can be associated with the various components of the device/assembly 3. For example, in the case where the assembly 3 is medical device (e.g., housings, electrode leads, stents, heart valves, etc.), the markers 1 can be placed on or at various components such as, for example, headers, feedthroughs, leads, housings, etc.

In the example of FIG. 1, the identifier of the PCB 3 can be generated by a predetermined sequence of reading the markers 1. For example, the markers 1 may be read by scanning from a left-side of the PCB 3 to the right-side of the PCB 3, scanning from a top-side of the PCB 3 to a bottom-side of the PCB 3, scanning in a zigzag path, and/or scanning in some other (pre-)defined course or path. Further, regardless of how the markers 1 are scanned, data acquisition of the proxy values and/or data processing to form the combination of proxy values, and thus the generation of identifiers can be performed in any number of ways. Thus, the system can be configured so that a scan can be performed to capture the data of all markers 1 simultaneously, and then a determined data acquisitioning and/or data processing sequence can be used to generate an identifier. For example, instead of scanning in a predetermined path, a scanning sequence, either pre-programmed or programmed at the time of execution, can be done to generate a "snapshot" of the entire topology of the assembly, capturing all data from all of the markers simultaneously and storing the data in the non-transitory memory. A data acquisitioning sequence, either pre-programmed or programmed at the time of execution, can acquisition certain proxy values from certain markers 1 in a certain sequence to form an array. Further, a data processing sequence, either pre-programmed or programmed at the time of execution, can be used to form combinations of proxy values, as described above. Other sequences can be used. Further, any one of the scanning step, data acquisitioning step, and data processing step can result in an identifier. Thus, the combination of proxy values by the data processing step is not the only way to generate an identifier with the system 10.

With such a method and system 10, a plurality of identifiers for an assembly can be obtained with the same number of markers by adjusting the scan path, the data acquisition sequence, and/or the data processing sequence. Hence, any number of reading sequences (e.g., scanning sequences, data acquisition sequences, and/or data processing sequences) can be used to read the markers. For example, a first identifier (e.g., corresponding to manufacturer information) can be generated by scanning the PCB 3 from the left-side of the PCB 3 to the right-side of the PCB 3 and placing all of the proxy values in a first identifier array. A second identifier (e.g., corresponding to assembly usage data) can be generated by scanning the PCB 3 from the right-side of the PCB 3 to the left-side of the PCB 3 and placing all of the proxy values in a second identifier array. Further, a third identifier (e.g., corresponding to safety code regulation information) can be generated by processing the data from the first identifier array to generate another array with all of marker-1 proxy values added, all of marker-2 proxy values added, etc. The resultant identifier(s) can be a numeric, alpha-numeric and/or other character used to identify the PCB and/or features and/or characteristics about the PCB, such as manufacturer information, usage data, safety code regulation information, etc.

Other reading sequences can be used, such as, for example, reading all marker-i type markers in a serial manner from a left-side of the PCB to the right-side, reading all marker-i type markers in a parallel manner from a left-side of the PCB to the right-side, reading all marker-i type markers in determined zigzag course over the topology of the PCB, etc. Markers can be read in series order, parallel order, series-parallel order, etc. As noted earlier, "reading" can include any one of a scanning sequence, a data acquisition sequence, and/or a data processing sequence, and thus any combination or permutation of reading sequences can be used to generate a hosted identifier information.

A reader 5 may be any device that can scan for and identify the marker's distinguishable feature. This can include recording the distinguishable features associated with the marker that corresponds to the proxy value. The reader 5 may also process, store, and/or transmit the proxy value associated with the marker 1. In other embodiments, the reader 5 can cause activation of the marker 1 so that the marker produces the distinguishable feature (e.g., a detectable signal). For example, the reader 5 can be a RFID reader used to interrogate and capture the radio waves associated with a marker 1 that is a RFID tag. A reader 5 can be an optical camera operatively associated with a charged coupled device ("CCD") used to detect a variation in color, shade, translucence, etc. A reader 5 can be an IR emitter and/or near IR emitter used with an image capturing device. A reader 5 can be a vision based tool, a chemical sensing tool, or another suitable tool that can sense color, chemicals, number of features, size, and/or shapes of features, etc. Any reader 3 can be operatively associated with a processor 6 configured to execute image recognition software, pattern recognition software, optical character recognition software, radio frequency identification software, and/or other automatic identification and data capture software. The processor 6 can be a hardware unit configured to execute a software program and may be operatively associated with a non-transitory memory. In an alternative embodiment, the processor 6 can be a computing device that is ancillary to the reader 5. In such an embodiment, the reader 5 can be placed into communication with the computing device so that data captured by the reader 5 can be transmitted to and from the computer device and be processed by the processor 6 of the computing device. This can be achieved by data transfer links 7, like hardwire communication links and/or wireless communications via transmitters, receivers, transceivers, communication networks, etc.

The reader 5 can read any number of different types of markers 1 by performing any number of a scanning sequence, a data acquisition sequence, and/or a data processing sequence. Thus, the reader 5 can be any combination of the automatic identification and data capture devices described above and the processor 6 can execute any combination of the software described above. The processor 6 can be programmed perform any of the scanning, the data acquisitioning, and the data processing sequences in a programmable order or scheme. Further, the processor 6 can be programmed to cause the reader 5 to perform any of the scanning, the data acquisitioning, and the data processing sequences in a programmable order or scheme.

In some embodiments, the markers 1 are associated with the components 2 and/or assembly 3 so as to be arranged in a predetermined pattern. Thus, the reading of the markers 1 can generate an identifier based on the pattern exhibited by the marker arrangement. Therefore, while the reading can be performed by scanning, data acquisitioning, and data processing in a predetermined and programmable fashion to generate a certain identifier, the arrangement of markers 1 can also be used to generate a certain identifier, regardless of the reading scheme used. In further embodiments, the arrangement of markers 1 can be an encryption for the identifier and the reading sequence can serve as the decryption of the identifier. For instance, the user and/or system 10 causing the reading to occur may not be able to obtain the correct identifier unless the predetermined arrangement of markers and/or programmed reading sequence is known by the user or provided to the system 10.

A method of implementing the system 10 can be performed by associating a plurality of markers 1 with portions of the assembly 3 or components 2 of the assembly 3, wherein the markers 1 may be of one or a plurality of different types of markers 1. The associating may further include arranging the plurality of markers 1 in a predetermined pattern. A proxy value can then be associated with each of the various markers 1. The plurality of markers 1 may be read with a reader 5 by performing at least one of a scanning sequence, a data acquisition sequence, and a data processing sequence. An identifier may then be generated by forming a combination of the proxy values with a processor 6, where the identifier is associated with the assembly. Forming the combination of the proxy values can further include generating a plurality of identifiers for the assembly 3. The type of marker 1 can include a distinguishable feature of the marker 1 or a distinguishable feature of an object the marker 1 is associated with. Further, the arrangement of the plurality of markers 1 in the predetermined pattern can be used as a means to encrypt the identifier, and the reading of the plurality of markers 1 can be used as a means to decrypt the identifier.

Figure 2:
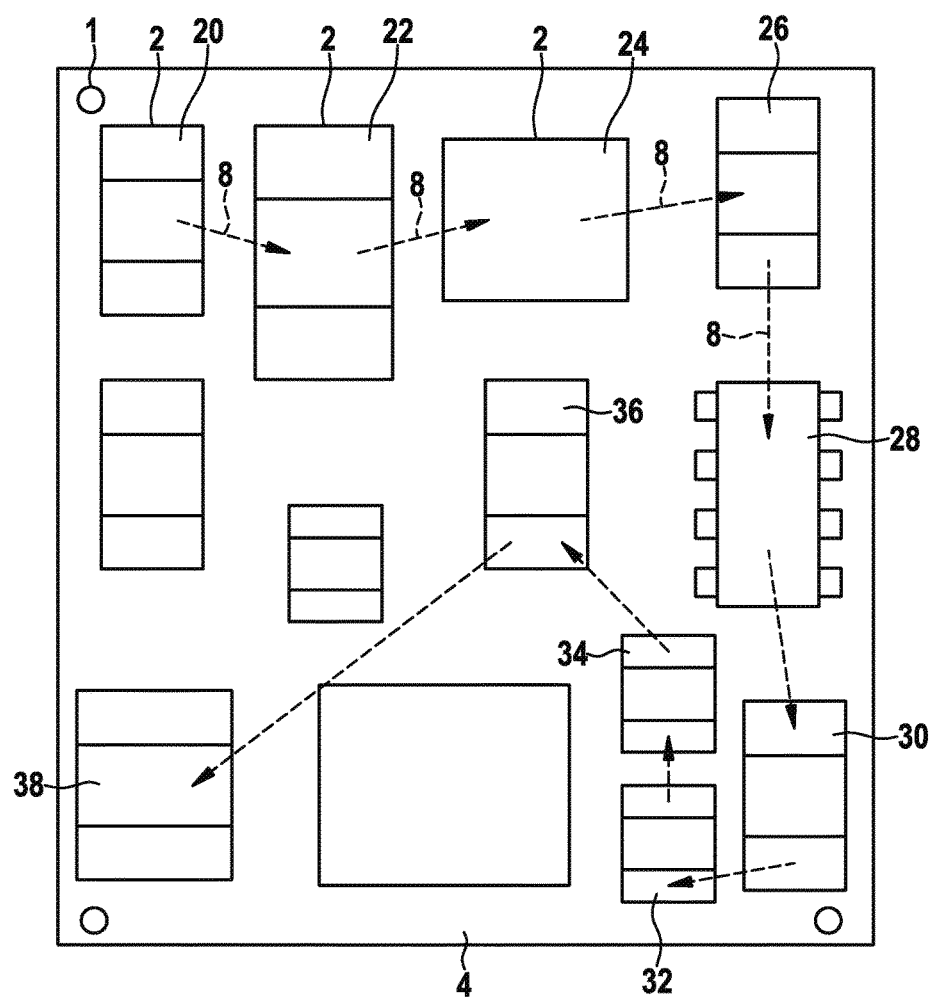
FIG. 2 shows a printed circuit board ("PCB") as an exemplary assembly to be identified by markers associated with various components of the PCB.
Figure 3:
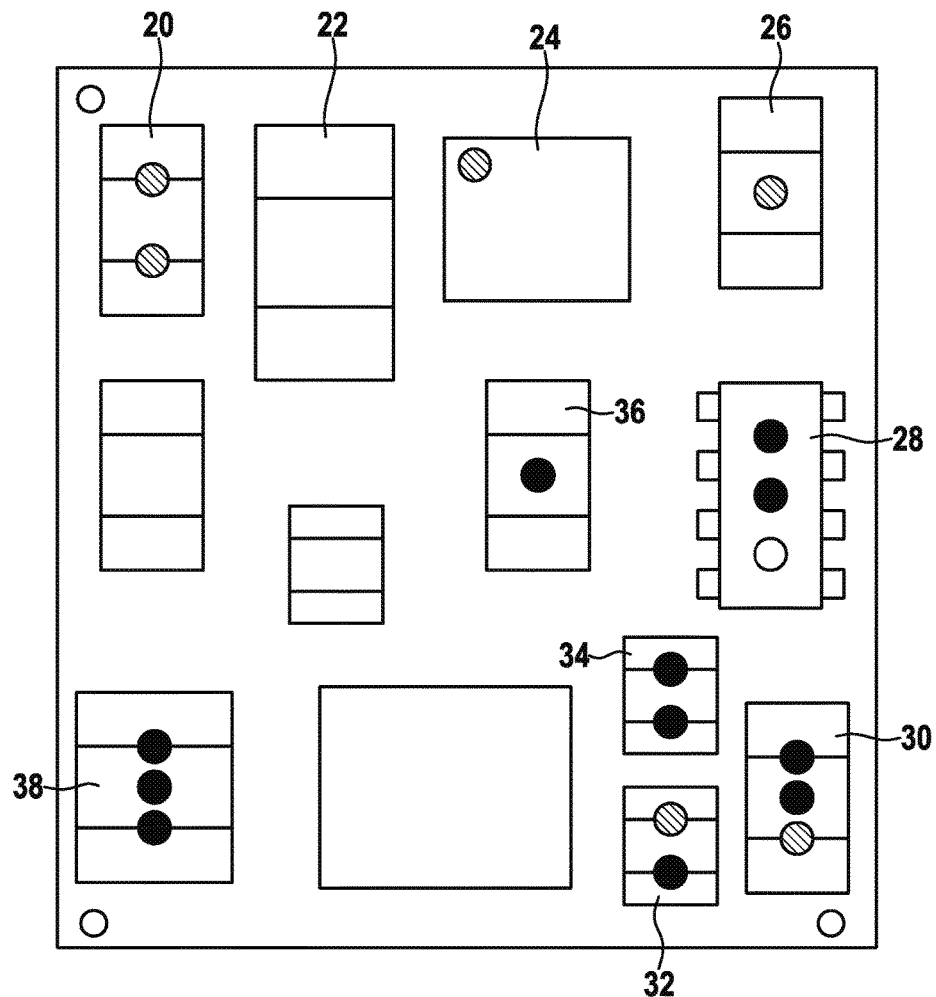
FIG. 3 shows an exemplary identifier generated by following the exemplary reading sequence shown in FIG. 2 and the exemplary data processing sequence shown in Table 1.

Referring now to FIGS. 1-3, an exemplary implementation of the presently disclosed system 10 and method is disclosed. The device/assembly is a PBC 3, which includes various components 2 thereon. As shown in FIG. 1, some of the components 2 have markers 1 and some do not. A reader 5 reads the markers 1 in a manner described above, and the data is transferred via a data transfer link 7 to a processor 6 of a computing device to generate an identifier for the PCB. As shown in FIG. 1, in one specific embodiment, the markers 1 may also be provided at predetermined positions on the substrate (e.g., a marker 12) and on predetermined components (e.g., marker 14).

In the exemplary implementation, the markers 1 are prints of ink, wherein each marker type is a different color of ink. The markers 1 can be created and applied to a component via inkjet printing of a color marker, laser marking of a color marker, inkjet printing of a dye or other chemical that can be sensed, etc. Thus, each predetermined component 2 and/or portion of the substrate 4 has been associated with a marker 1 corresponding to an individual sub-block. A compilation of sub-blocks (e.g., a compilation of proxy values read from the marks) is then used to form an identifier. In the exemplary implementation, the identifier is a "serial number" or "identification code" used to identify the PCB 3. Of course, the identifier could identify a feature and/or characteristic of the PCB 3.

The proxy values associated with the marker types for the exemplary implementation is shown in the following Table 1:

TABLE 1

Data Processing Table that may be used with the disclosed system and method to assign proxy values to markers

| Marker value | Marker color | Marker color | Marker color |
|---|---|---|---|
| 0 | — | — | — |
| 1 (proxy value) | — | — | white |
| 2 (proxy value) | — | — | grey |
| 3 (proxy value) | — | — | black |
| 4 | — | grey | grey |
| 5 | — | black | grey |
| 6 | — | black | black |
| 7 | grey | grey | — |
| 8 | black | black | grey |
| 9 | black | black | black |

As shown in Table 1, each white marker has a proxy value of "1", each grey marker has a proxy value of "2", and each black marker has a proxy value of "3". The corresponding Data Processing Table as shown in Table 1 shows that the marker proxy values are added to form the particular marker value.

The PCB 3 is scanned in the predetermined reading or scanning sequence 8, shown in FIG. 2 as a sequence of arrows, to generate the identifier. As shown in FIGS. 2 and 3, the scanning sequence 8 is in the order of components 20, 22, 24, 26, 28, 30, 32, 34, 36 and 38. Scanning in the series sequence 8 of FIG. 2 forms an array to provide the identifier. The following Table 2 shows the decryption of the sequence 8 of FIG. 2, in application of the Data Processing Table shown in Table 1:

TABLE 2

Decrypting Table of the sequence 8, shown in FIG. 2, in application of the Data Processing Table, shown in Table 1

| Component (as shown in FIG. 2) | Marker color | Marker color | Marker color | Marker value |
| --- | --- | --- | --- | --- |
| 20 | — | grey | grey | 4 |
| 22 | — | — | — | 0 |
| 24 | — | — | grey | 2 |
| 26 | — | — | grey | 2 |
| 28 | black | black | white | 7 |
| 30 | black | black | grey | 8 |
| 32 | — | grey | black | 5 |
| 34 | — | black | black | 6 |
| 36 | — | — | black | 3 |
| 38 | black | black | black | 9 |

The system generated an array of "4022785639", which corresponds to the various marker values on the components 2. This array represents the identification number of the PCB 3.

While white, grey and black were used in the example above, the markers could take any colors and/or any of the forms previously described herein (e.g., dots, shapes, features, indentations, protrusions, chemicals, fluorescence, etc.

Additionally, as will be appreciated by one skilled in the art, the PCB 3 may be replaced with a medical device, and the scanning may be performed on the various elements of the medical device (each of which includes a marker) in a predetermined order to generate an identification number of the medical device.

It will be apparent to those skilled in the art that numerous modifications and variations of the described examples and embodiments are possible in light of the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof. Additionally, the disclosure of a range of values is a disclosure of every numerical value within that range, including the end points.

LIST OF REFERENCE NUMERALS

1 Marker
2 Component
3 Device or Assembly
4 PCB substrate
5 Reader
6 Processor
7 Data transfer links
8 Predetermined reading or scanning sequence
10 System for Identification
12 Marker on substrate
14 Marker on predetermined component 2
20 to 38 components in predefined order

We claim:

1. A method for identifying an assembly, comprising:
providing a plurality of markers on components of the assembly and/or portions of the assembly, each of the plurality of markers having an associated proxy value which comprises a sub-block of an identifier of the assembly;
reading the plurality of markers on the components of the assembly and/or the portions of the assembly with a reader by performing at least one of a scanning sequence, a data acquisition sequence, and a data processing sequence, wherein the reading step is performed in a predetermined sequence; and
decrypting, with a processor, the proxy values of detected markers in the predetermined sequence to generate the identifier of the assembly.

2. The method of claim 1, wherein the assembly comprises printed circuit board.

3. The method of claim 1, wherein the assembly comprised a medical device.

4. The method of claim 1, wherein the identifier is associated with the assembly itself or at least one of a feature and a characteristic of the assembly.

5. The method of claim 1, wherein each of the plurality of markers comprises a distinguishable feature capable of being read by the reader.

6. The method of claim 5, wherein the distinguishable feature comprises at least one marker type, and wherein the marker type includes a number of dots, a shape, a color, an indentation, a protrusion, a chemical or a fluorescence capable of being read by the reader.

7. A method for generating an identification number of an assembly, comprising:
marking components of the assembly and/or portions of the assembly with a sequence of coded portions of the identification number of the assembly;
reading the coded portions with a reader in a predetermined sequence; the predetermined sequence corresponding to the identification number of the assembly as represented by the coded portions; and
decrypting, with a processor, the read coded portions to generate the identifier of the assembly.

8. The method of claim 7, wherein the reading step comprises performing at least one of a scanning sequence, a data acquisition sequence, and a data processing sequence.

9. The method of claim 7, wherein the coded portions comprise markers provided on the components and/or the portions of the assembly, wherein each of the markers has an associated proxy value which comprises a sub-block of the identifier of the assembly.

10. The method of claim 9, wherein each of the plurality of markers comprises a distinguishable feature capable of being read by the reader.

11. The method of claim 10, wherein the distinguishable feature comprises at least one marker type, and wherein the marker type includes a number of dots, a shape, a color, an indentation, a protrusion, a chemical or a fluorescence capable of being read by the reader.

12. A system for identifying an assembly, comprising:
a plurality of markers provided on components and/or portions of the assembly, wherein each marker of the plurality of markers comprises a type of marker and each type of marker is further associated with a proxy value which comprises a sub-block of an identifier of the assembly;
a reader capable of reading the plurality of markers by at least one of a scanning sequence, a data acquisition sequence, and a data processing sequence; and
a processor receiving data from the reader corresponding to the read markers and decrypting the received data to determine the respective proxy values and generate an identifier of the assembly,
wherein the reader reads the markers in a predetermined sequence corresponding to the identifier of the assembly.

13. The system of claim 12, wherein the type of marker comprises at least one of a distinguishable feature capable of being read by the reader.

14. The system of claim 13, wherein the distinguishable feature comprises at least one marker type, and wherein the marker type includes a number of dots, a shape, a color, an indentation, a protrusion, a chemical or a fluorescence capable of being read by the reader.

15. The system of claim 12, wherein the processor determines the respective proxy values and generates the identifier of an assembly Data Processing Table which correlates the markers with respective proxy values.

16. The system of claim 12, wherein the reader reads the plurality of markers in a scheme that is at least one of a series order, a parallel order, and a series-parallel order.

17. The system of claim 12, wherein the reader is at least one of a RFID reader, an optical camera, an infrared emitter, and a visual based tool to sense color, chemicals, number of features, size, and/or shapes of feature.

* * * * *